United States Patent [19]

Whiting

[11] Patent Number: 5,075,614

[45] Date of Patent: Dec. 24, 1991

[54] DEVICE ASCERTAINING THE TIME REQUIRED TO CHARGE A BATTERY AND TIMING THE CHARGE

[75] Inventor: John S. Whiting, Robbinsdale, Minn.

[73] Assignee: Century Mfg. Co., Minneapolis, Minn.

[21] Appl. No.: 407,867

[22] Filed: Sep. 15, 1989

[51] Int. Cl.$^5$ .......................... H02J 7/00; H01M 10/46
[52] U.S. Cl. ............................................ 320/2; 320/38; 320/48
[58] Field of Search .................... 320/2, 20, 37, 38, 48

[56] References Cited

U.S. PATENT DOCUMENTS

| | | | |
|---|---|---|---|
| 2,347,452 | 4/1944 | Amsden | 320/37 X |
| 2,421,828 | 6/1947 | Bruney | 320/20 |
| 2,431,707 | 12/1947 | Pugh | 320/38 X |
| 2,436,057 | 2/1948 | Pugh | 320/37 X |
| 2,654,865 | 10/1953 | Klug | 324/106 |
| 2,991,413 | 7/1961 | Taylor | 324/295 |
| 3,118,137 | 1/1964 | Vincent | 340/636 |
| 3,383,580 | 5/1968 | Wallace, Jr. | 320/48 |
| 3,401,337 | 9/1968 | Beusman et al. | 324/149 |
| 4,075,560 | 2/1978 | Stifter | 324/131 |
| 4,217,534 | 8/1980 | Cole | 320/2 X |
| 4,625,175 | 11/1986 | Smith | 324/430 |

*Primary Examiner*—R. J. Hickey
*Attorney, Agent, or Firm*—Leo Gregory

[57] ABSTRACT

A battery charger embodying a meter which states the time required to charge a battery and which times the battery charge.

5 Claims, 2 Drawing Sheets

DEVICE ASCERTAINING THE TIME REQUIRED TO CHARGE A BATTERY AND TIMING THE CHARGE

BACKGROUND OF THE INVENTION

1. Field of the Invention

Relates to a timing device which indicates the charged condition of a battery.

2. Brief Description of the Prior Art

Presently known battery chargers read open circuit voltage and the percent of charge in a battery.

Known also are battery chargers having meters which provide a reading requiring reference to a chart or the use of an equation to determine the time required to charge a battery.

In U.S. Pat. No. 3,118,137 to Long, a disclosure is made to indicate when the terminal voltage of a battery falls below a predetermined value as a warning indicator.

In U.S. Pat. No. 2,991,413 to Taylor, a battery voltage indicator is disclosed to show the general level of the battery charge, such as "high", "medium" and "low".

In U.S. Pat. No. 3,383,580 to Wallace, Jr., a device is disclosed indicating when a drop in battery potential is below a useful level.

In U.S. Pat. No. 2,654,865 to Klug, a termally actuated voltage indicator shows the relative charge of a storage battery.

It is desired to provide a more exact determination of the charge condition of a lead acid storage battery.

SUMMARY OF THE INVENTION

It is the main object of this invention to provide an exact determination of the time interval required to charge a battery, such as an automobile battery, and to automatically control the timing of the charge.

It is a further object of the invention herein to provide a battery charger which measures the open circuit voltage of a battery for conversion into the interval of time that would be required to fully charge the battery and further automatically time the interval required to charge the battery.

These and other objects and advantages of the invention will be set forth in the following description made in connection with the accompanying drawings in which like reference characters refer to similar parts throughout the several views.

DESCRIPTION OF A PREFERRED EMBODIMENT

Figure 1:
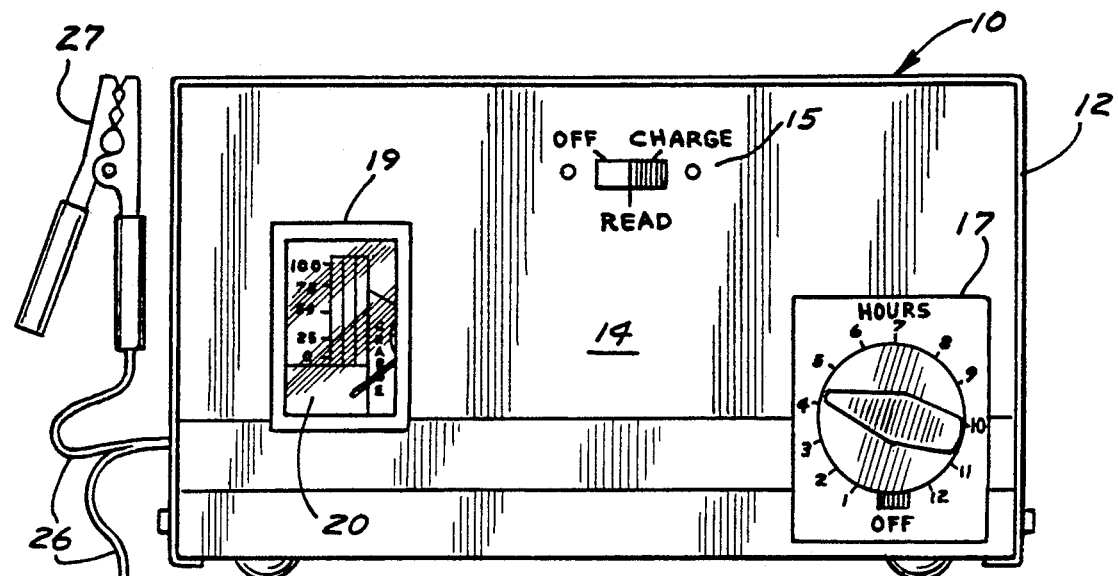
FIG. 1 is a view in elevation showing the face of the battery charger herein.
Figure 2:
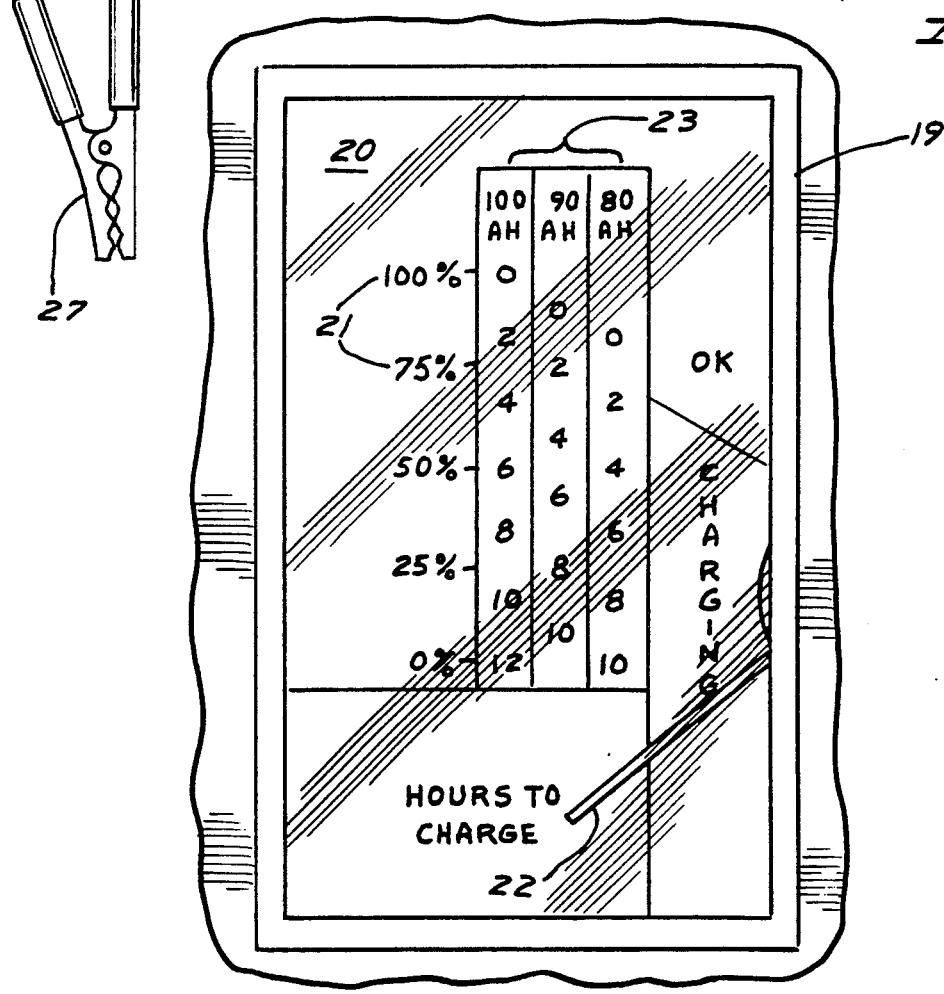
FIG. 2 is an enlarged view in elevation of a meter of said battery charger.

Referring to FIG. 1, a 10 amp/12 volt battery charger 10 is shown comprising a housing 12 having a front wall 14 upon which are shown a switch 15 having "Off", "Read" and "Charge" positions and also thereon is a conventional timer 17. Further included on said front wall is a standard commercial milliamp meter 19 having a dial 20 thereon with a percentage scale 21 showing the percent of charge in the battery indicated by a pointer 22. In addition to said percent figures on said dial and corresponding therewith are the hour readings 23 giving the time interval required to charge the battery in hours according to the percent of charge figure. Said scales here shown are for 100 AH, 90 AH and 80 AH batteries, AH indicating ampere hours. Thus the pointer 22 will indicate the percentage of charge condition of a battery and the corresponding time required to fully charge the battery which will be the hour time on the appropriate battery scale most closely related to the indication of the pointer. Reference is had to a lead acid storage battery.

In connection with said battery charger, for a hook up with a battery, are conventional cables 26 having battery clamps 27.

Figure 3:
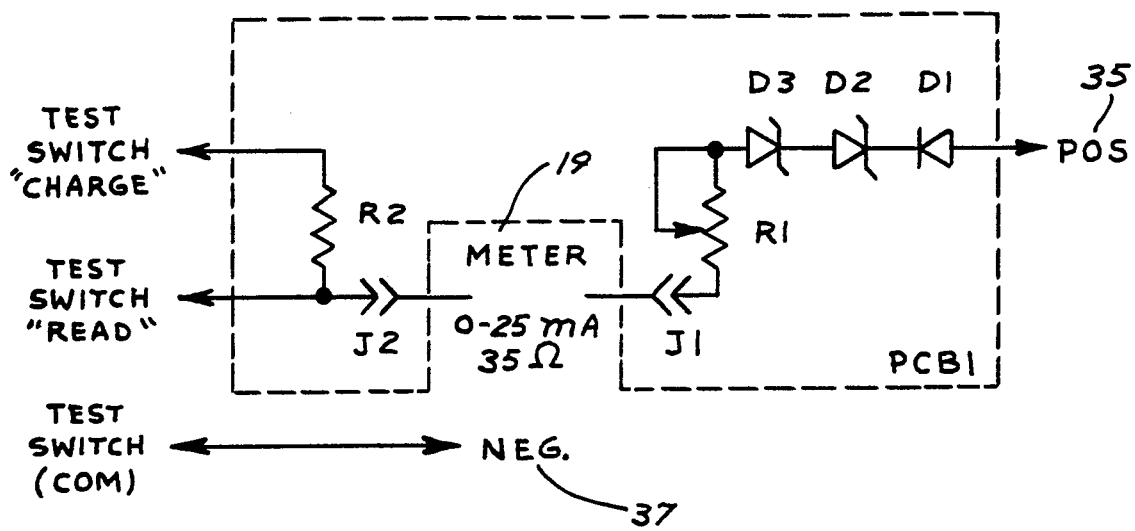
FIG. 3 is a schematic diagram relating particularly to the charging meter.

In connection with said charger is the schematic wiring diagram of FIG. 3 by means of which the charge condition of a battery is ascertained.

The circuit of FIG. 3 in the present embodiment consists of a 200 ohm potentiometer R1, a 150 ohm resistor R2, a IN4007 diode D1 a 1N5232 zener diode D3 and a 1N751 zener diode D2. The circuit connects to said meter 19, a 35 ohm milliamp meter. The meter deflection is a linear function of the amount of current which passes through it. Said meter 19, in the present embodiment, is calibrated to have zero milliamps cause no scale deflection and to have twenty-five milliamps cause a full scale deflection. The diode D1 protects the circuit and meter against a reverse or incorrect connection of a battery clamp. It also provides a 0.6 voltage drop thereacross. The zener diodes D2 and D3 block the current flow through the circuit until their breakover voltage is reached. The diode D3 requires 5.6 volts across it before it conducts. The diode D2 requires 5.1 across it before it conducts. It takes a voltage greater than 11.3 (5.6+5.1+0.6) before current will flow in the circuit. The potentiometer adjusts the amount of current flowing through the circuit. It is used to calibrate the circuit in designing the same. If the battery were fully charged its output voltage would be 12.72. This has reference to a 100 AH battery. With this voltage across the circuit, the three diodes would conduct dropping 11.3 volts. This leaves 1.42 volts across the potentiometer and the meter. L With the potentiometer adjusted to 21.8 ohms, for purposes herein, 25 milliamps are flowing through the meter causing a full scale deflection of the meter. This is indicated on the meter as a fully charged condition.

The formula which relates open circuit voltage to current flowing through the meter is $$\frac{\text{open circuit voltage} - 11.3 \text{ volts}}{35 \text{ ohms} + 21.8 \text{ ohms}} = \text{current through the meter} \quad \text{Eq. 1}$$

$$\text{OHMS LAW: current} = \frac{\text{voltage}}{\text{resistance}}$$

The range of time for charging a battery is from zero to 12.5 hours for a 100 AH battery. This is obtained from the formula:

$$AH \text{ size of a battery} \times \frac{\% \text{ of charge needed}}{\text{average ampere output of charge}} = \frac{\text{time required to charge battery}}{} \quad \text{Eq. 2}$$

-continued

Example: $\dfrac{100\ AH\ \text{battery} \times 100\%\ \text{charge needed}}{8\ \text{amps}} = 12.5\ \text{hours}$ Both equations are linear functions so that they can be represented using a linear circuit.

In view of the described circuitry, to carry out the operation, the switch 19 is set on its "Read" position. The cable clamps 27 are attached to the battery terminals. The meter 19 responsive to the open circuit voltage of the battery provides the reading of the hours of time required to charge the battery. The timer 17 is then set for the number of hours required for charging the battery. The switch 15 position is changed from "Read" to "Charge". At the expiration of the time set for charging the battery, the timer shuts off the charging circuit.

The relationship between open circuit voltage and percent of charge in the battery and the relationship between the percent of charge figure and hours required to charge the battery are linear. Hence it is possible to use a linear circuit to indicate the hours required to charge a battery as a function of open circuit voltage. Any non-linearity can be corrected by adjusting the meter artwork.

As above described, a battery is readily charged by hooking up the battery charger cable clamps to the battery terminal, positioning the switch, reading on the meter dial the time required to charge the battery, setting the timer for the required time to charge after setting the switch to the "Charge" position and then you may leave. The charging will be terminated by the timer at the time set.

As above described, a situation was indicated wherein the battery was fully charged. Now if the battery is not fully charged, there will be a voltage differential across the test circuit between zero and 1.42 as the charger is presently calibrated and the zero voltage indication will require a full maximum charge period.

If the open circuit voltage, in the present embodiment, is less than 11.3 volts, the diodes will not conduct and the indicator 22 will make no indication. This means that the battery requires to be charged for the maximum time on the appropriate scale and the times will be set accordingly.

The significant contribution of the meter 19 and the timer 17 is that an inexperienced person can safely charge an automotive battery with no risk of overcharging and with the knowledge that when charged, the battery will be fully charged. It is seen that the charge condition of the battery may be tested immediately.

The circuit of FIG. 3 is included on a circuit board positioned within the housing 12 of a conventional battery charger equipped with a timer.

The timer in a conventional manner is placed in circuit with the "Charge" position top of the switch 15 and the output lines 35 and 37 of the circuit are in circuit with the positive and negative battery charger cable clamps. This wiring is all well known in the art and deemed not to be required to be shown.

It will of course be understood that various changes may be made in form, details, arrangement and proportions of the product without departing from the scope of the invention which, generally stated, consists in a product capable of carrying out the objects above set forth, in the parts and combination of parts disclosed and defined in the appended claims.

What is claimed is:

1. A battery charger assembly, having in combination means to connect a battery charger with a battery,
a first circuit in said battery charger adapted to read the charge condition of a battery,
a second circuit in said battery charger adapted to charge said battery,
a switch embodied in said battery charger in connection with said first and second circuits,
said switch being adapted to cause said first circuit to read the charge condition of said battery,
means responsive to said reading of said charge condition for conversion of said reading into time in hours required to charge said battery,
a timer embodied in said charge in connection with said second circuit adapted to be set for the hour required to charge said battery,
said switch being adapted to open said first circuit and close said circuit upon the timer being set for charging said battery,
said first circuit including diodes in combination adapted to pass charging current when the voltage sensed by said diodes is less than the open circuit voltage of a fully charged battery, and
means included in said timer shutting off charging of the battery by said second circuit upon expiration of time for charging set upon said timer.

2. A battery charger assembly, having in combination means to connect a battery charger with a battery,
a first circuit in said battery charger embodying means adapted to read the charge condition of a battery,
a second circuit in said battery charger adapted to charge a battery,
a switch embodied in said battery in connection with said first and second circuits,
said switch being adapted to cause said first circuit to read the charge condition of a battery,
means responsive to said reading for conversion of the same into time in hours required to charge the battery,
a timer in connection with said second circuit adapted to be set for the time required to charge said battery,
said switch being adapted to open said first circuit and close said second circuit upon said timer being set for the charging of said battery, and
means in connection with said timer adapted to shut off said second circuit upon expiration of the time set upon said timer.

3. A battery charger assembly, having in combination means to connect a battery charger with a battery,
a first circuit in said battery charger adapted to read the charge condition of a battery,
a second circuit in said battery charger adapted to charge a battery,
a switch embodied in said battery charger in connection with said first and said second circuits,
said switch being adapted to cause said first circuit to read the charge condition of battery,
means responsive to said reading converting the same into the time required to charge said battery,
said switch being adapted to open said first circuit and close said second circuit to charge said battery,
a timer embodied in said charger in connection with said second circuit adapted to be set for said time required to charge said battery, and means embodied in said timer adapted to terminate charging by said second circuit when said required time to charge said battery has passed.

4. The structure of claim 2, wherein
said first circuit includes in combination a diode and a pair of zener diodes having a combined breakover voltage less than the open circuit voltage of a fully charged battery, and
said first circuit reading the differential between the breakover voltage and the open circuit voltage of said battery, and
said reading indicating the charge condition of said battery.

5. The structure of claim 3, wherein
said first circuit embodies a diode and a pair of zener diodes having a combined breakover voltage which is greater than the open circuit voltage of a less than a fully charged battery,
said first circuit reading the differential between the breakover voltage of said diodes and the open circuit voltage of said battery, and
said second mentioned means converting said reading into the time required to fully charge said battery.

* * * * *